United States Patent
Li et al.

(10) Patent No.: US 7,550,760 B2
(45) Date of Patent: Jun. 23, 2009

(54) POLYACENES AND ELECTRONIC DEVICES GENERATED THEREFROM

(75) Inventors: Yuning Li, Mississauga (CA); Ping Liu, Mississauga (CA); Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 206 days.

(21) Appl. No.: 11/399,216

(22) Filed: Apr. 6, 2006

(65) Prior Publication Data

US 2007/0252138 A1  Nov. 1, 2007

(51) Int. Cl.
H01L 35/24 (2006.01)
(52) U.S. Cl. ............ 257/40; 257/E51.025; 585/26
(58) Field of Classification Search .......... 257/40, 257/E51.025; 528/86; 585/26
See application file for complete search history.

(56) References Cited

U.S. PATENT DOCUMENTS

| | | | |
|---|---|---|---|
| 5,619,357 A | 4/1997 | Angelopoulos et al. | |
| 5,777,070 A | 7/1998 | Inbasekaran et al. | |
| 5,969,376 A | 10/1999 | Bao | |
| 6,107,117 A | 8/2000 | Bao et al. | |
| 6,150,191 A | 11/2000 | Bao | |
| 6,770,904 B2 | 8/2004 | Ong et al. | |
| 2005/0017311 A1 | 1/2005 | Ong et al. | |
| 2005/0215732 A1* | 9/2005 | Watanabe et al. | 526/62 |
| 2006/0131570 A1* | 6/2006 | Meng | 257/40 |

OTHER PUBLICATIONS

See the "Cross Reference to Related Applications" on pp. 1 and 2 of the Specification Being Filed Concurrently.
Ong, Beng, et al., U.S. Appl. No. 11/011,678, filed Dec. 14, 2004 on Compound with Indolocarbazole Moieties and Devices Containing Such Compound.
Ong, Beng, et al., U.S. Appl. No. 11/167,512, filed Jun. 27, 2005 on Compound with Indolocarbazole Moieties and Devices Containing Such Compound.
Huang, D.H., et al., "Conjugated Polymers Based on Phenothiazine and Fluorene in Light-Emitting Diodes and Field Effect Transistors", *Chem. Mater.* 2004, 16, 1298-1303.
Zhu, Y., et al, "Phenoxazine-Based Conjugated Polymers: A New Class of Organic Semiconductors for Field-Effect Transistors", *Macromolecules* 2005, 38, 7983-7991.

* cited by examiner

*Primary Examiner*—Thao X Le
*Assistant Examiner*—Tanika Warrior
(74) *Attorney, Agent, or Firm*—Eugene O. Palazzo; Fay Sharpe LLP

(57) ABSTRACT

An electronic device comprises a semiconductive material containing a homopolyacene of Formula (I):

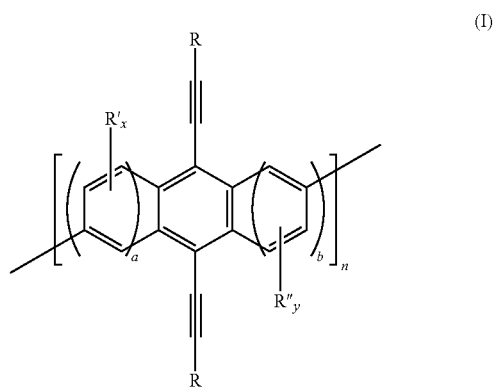

wherein R is a suitable hydrocarbon, a halogen, or a heteroatom containing group; each R' and R" are independently a suitable hydrocarbon, a heteroatom containing group, or a halogen; a represents a number of benzene rings on a left side of the central benzene ring; b represents a number of benzene rings on a right side of the central benzene ring; x represents a total number of R' groups on the left side of the central benzene ring; y represents a total number of R" groups on the right side of the central benzene ring; and n represents the number of repeating units and is from 2 to about 5,000.

32 Claims, 2 Drawing Sheets

POLYACENES AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS-REFERENCE TO RELATED APPLICATIONS

U.S. application Ser. No. 11/398,981, filed concurrently herewith, on Functionalized Heteroacenes and Electronic Devices Generated Therefrom, by Yuning Li et al.

U.S. application Ser. No. 11/399,226, filed concurrently herewith, on Functionalized Heteroacenes, by Yuning Li et al.

U.S. application Ser. No. 11/399,064, filed concurrently herewith, on Heteroacene Polymers and Electronic Devices Generated Therefrom, by Yuning Li et al.

U.S. application Ser. No. 11/399,169, filed concurrently herewith, on Ethynylene Acene Polymers and Electronic Devices Generated Therefrom, by Yuning Li et al.

U.S. application Ser. No. 11/399,091, filed concurrently herewith, on Ethynylene Acene Polymers, by Yuning Li et al.

U.S. application Ser. No. 11/399,231, filed concurrently herewith, on Poly[bis(ethynyl)heteroacenes] and Electronic Devices Generated Therefrom, by Yuning Li et al.

U.S. application Ser. No. 11/399,141, filed concurrently herewith, on Semiconductors and Electronic Devices Generated Therefrom, by Yiliang Wu et al.

U.S. application Ser. No. 11/399,230, filed concurrently herewith, on Semiconductor Polymers, by Yiliang Wu et al.

U.S. application Ser. No. 11/398,941, filed concurrently herewith, on Polydiazaacenes and Electronic Devices Generated Therefrom, by Yiliang Wu et al.

U.S. application Ser. No. 11/398,902, filed concurrently herewith, on Polydiazaacenes, by Yiliang Wu et al.

U.S. application Ser. No. 11/398,931, filed concurrently herewith, on Poly(alkynylthiophene)s and Electronic Devices Generated Therefrom, by Beng S. Ong et al.

U.S. application Ser. No. 11/398,246, filed concurrently herewith, on Poly(alkynylthiophene)s, by Beng S. Ong et al.

U.S. application Ser. No. 11/399,092, filed concurrently herewith, on Linked Arylamine Polymers and Electronic Devices Generated Therefrom, by Yuning Li et al.

U.S. application Ser. No. 11/399,065, filed concurrently herewith, on Linked Arylamine Polymers, by Yuning Li et al.

Illustrated in U.S. application Ser. No. 11/011,678 filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference. In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in these copending applications and patent may be selected for the present invention in embodiments thereof.

BACKGROUND

The present disclosure is generally directed to polyacenes and uses thereof. More specifically, the present disclosure in embodiments is directed to a class of polyacenes selected as solution processable and substantially stable channel semiconductors in organic electronic devices, such as thin film transistors.

There are desired electronic devices, such as thin film transistors (TFT) fabricated with polyacenes, with excellent solvent solubility, which can be solution processed, and which devices possess mechanical durability and structural flexibility, characteristics which are selected for fabricating flexible TFTs on plastic substrates. Flexible TFTs enable the design of electronic devices with structural flexibility and mechanical durability characteristics. The use of plastic substrates together with the polyacene components can transform the traditionally rigid silicon TFT into a mechanically more durable and structurally flexible TFT design. Thus, can be of particular value to large area devices, such as large-area image sensors, electronic paper and other display media. Also, the selection of polyacene TFTs for integrated circuit logic elements for low end microelectronics, such as smart cards, radio frequency identification (RFID) tags, and memory/storage devices, may enhance their mechanical durability, and thus their useful life span.

A number of semiconductor materials are not, it is believed, stable when exposed to air as they become oxidatively doped by ambient oxygen, resulting in increased conductivity. The result is large off-current and thus low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Acenes, such as pentacene and heteroacenes, are known to possess acceptable field effect mobility, however, these materials are rapidly oxidized by, for example, atmospheric oxygen under light, and such compounds are not considered processable at ambient conditions. Furthermore, when selected for TFTs acenes tend to have poor thin film formation characteristics and are substantially insoluble thus they are essentially nonsolution processable; accordingly, such compounds have been primarily processed by vacuum deposition methods that result in high production costs, eliminated or minimized with the TFTs generated with the functionalized heterocenes illustrated herein.

A number of organic semiconductor materials has been described for use in field effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997); oligomers, such as sexithiophenes or their variants, see for example reference F. Garnier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics, such as smart cards and RFID tags.

Additionally, TFTs fabricated from polyacenes may be functionally and structurally more desirable than conventional silicons in that they may offer mechanical durability, structural flexibility, and the potential of being able to be incorporated directly onto the active media of the devices, thus enhancing device compactness for transportability. Also, a number of known small molecule or oligomer-based TFT devices rely on difficult vacuum deposition techniques for fabrication. Vacuum deposition is selected primarily because the small molecular materials are either insoluble or their solution processing by spin coating, solution casting, or stamp printing do not generally provide uniform thin films.

Further, vacuum deposition may also involve the difficulty of achieving consistent thin film quality for large area format. Polymer TFTs, such as those fabricated from, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are very sensitive to air. The TFTs fabricated from these materials in ambient conditions generally exhibit very large off-current, very low current on/off ratios, and their performance characteristics degrade rapidly.

Illustrated in Huang, D. H., et al, *Chem. Mater.* 2004, 16, 1298-1303, are, for example, LEDS and field effect transistors based on certain phenothiaazines like poly(10-(2-ethylhexyl)phenothiaazine).

Illustrated in Zhu, Y., et al, *Macromolecules* 2005, 38, 7983-7991, are, for example semiconductors based on phenoxazine conjugated polymers like poly(10-hexylphenoxazine).

Additional references that may be of interest include U.S. Pat. Nos. 6,150,191; 6,107,117; 5,969,376; 5,619,357 and 5,777,070.

BRIEF DESCRIPTION OF FIGURES

Illustrated in FIGS. 1 to 4 are various representative embodiments of the present disclosure, and wherein poly(9,10-bis(dodecynyl)anthracene 2,6 dilyl), poly(9,10-bis(ethynyl)anthracene-2,6-diyl), poly(9,10-didecynylanthracene-2,6-diyl), or mixtures thereof are selected as the channel or semiconductor material in thin film transistor (TFT) configurations.

SUMMARY

Figure 1:
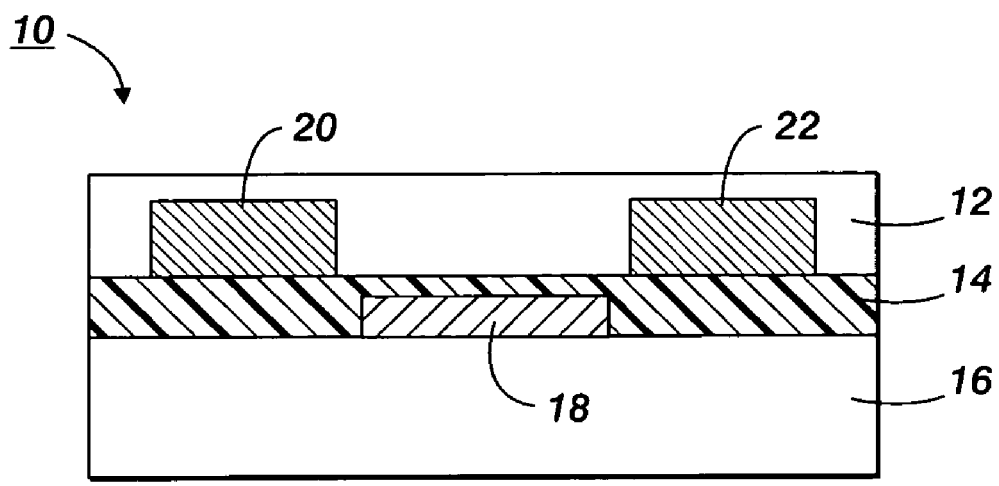

It is a feature of the present disclosure to provide semiconductors, polyacenes, which are useful for the generation of microelectronic devices, such as TFT devices.

It is another feature of the present disclosure to provide a polyacene with a band gap of from about 1 eV to about 3 eV as determined from the absorption spectra of thin films thereof, and which polyacene is suitable for use as a TFT semiconductor channel layer.

In yet a further feature of the present disclosure there is provided a polyacene which is useful as microelectronic components, and which polyacene possesses solubility of, for example, at least about 0.1 percent by weight and to about 95 percent by weight in common organic solvents, such as methylene chloride, tetrahydrofuran, toluene, xylene, mesitylene, chlorobenzene, dichlorobenzene, and the like, and thus these components can be economically fabricated by solution processes, such as spin coating, screen printing, stamp printing, dip coating, solution casting, jet printing, and the like.

Also, in yet another feature of the present disclosure there are provided novel polyacenes, and devices thereof, and which devices exhibit enhanced resistance to the adverse effects of oxygen, that is, these devices exhibit relatively high current on/off ratios, and their performance does not substantially degrade as rapidly as similar devices fabricated with regioregular poly(3-alkylthiophene-3,5-diyl) or with acenes.

Additionally, in a further feature of the present disclosure there is provided a class of novel polyacenes with unique structural features, which permit molecular self-alignment under appropriate processing conditions, and which structural features also enhance the stability of the device. Proper molecular alignment can permit higher molecular structural order in thin films, which can be important to efficient charge carrier transport, thus higher electrical performance.

There are disclosed in embodiments, a polyacene and electronic devices thereof. More specifically, the present disclosure relates to polyacenes illustrated by or encompassed by Formula (I)

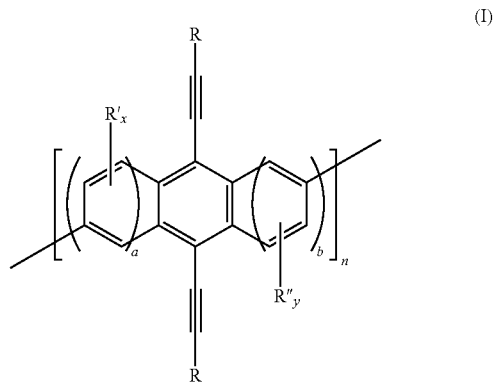

wherein, for example, each R is a hydrocarbon group with, for example, 1 to about 40 carbon atoms; a heteroatom containing group with, for example, 1 to about 60 carbon atoms; x and y each represent the number of groups, and can be, for example, from zero to about 12, and more specifically, wherein each x and y are from about zero to about 6; a and b each independently represent the number of rings, and more specifically, wherein a is from zero to about 6 and b is from zero to about 6; n represents the number of repeating units, such as for example, n is a number of from about 2 to about 5,000, and more specifically, from about 2 to about 1,000 or from about 5 to about 500; and the sum of x and y can be, for example, from zero to about 12, and the sum of a and b can be, for example, from about 2 to about 6.

In embodiments the number average molecular weight ($M_n$) of the polyacenes can be, for example, from about 500 to about 500,000, and more specifically, from about 1,000 to about 200,000, and the weight average molecular weight ($M_w$) thereof can be, for example, from about 600 to about 600,000, and more specifically, from about 1,000 to about 240,000, both as measured by gel permeation chromatography (GPC) with polystyrene as the standard.

In embodiments, the repeating unit is considered an important recurring unit of the polymer. The connection of the repeating units in the polymer may be identical, as is the situation with a regioregular polymer, or it may be dissimilar, as is the situation with a regiorandom polymer, and with respect primarily to a directional sense or aspect. Whether a repeating unit A is considered the same type or a different type as another repeating unit B is independent of directional sense when repeat unit A and repeat unit B are in the polymer. For instance, regiorandom poly(3-hexylthiophene) is considered to have only one type of repeating unit.

In embodiments, a class of polyacenes is represented by the following formulas

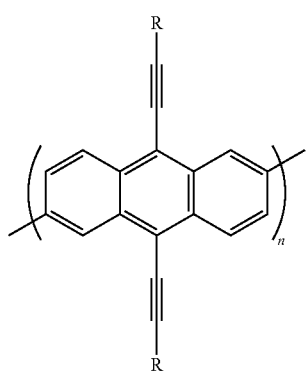

(1)

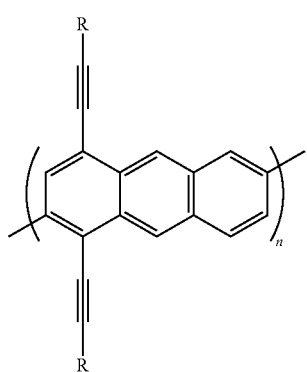

(2)

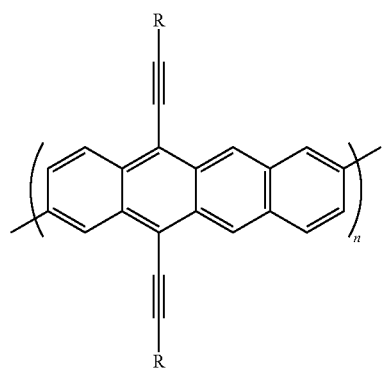

(3)

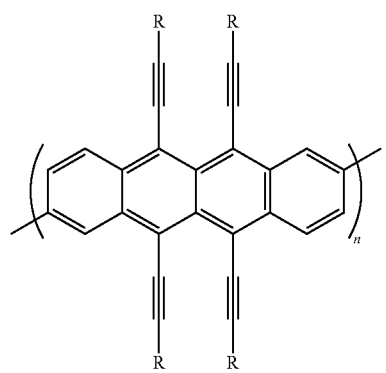

(4)

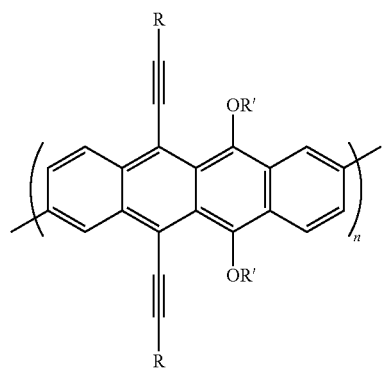

(5)

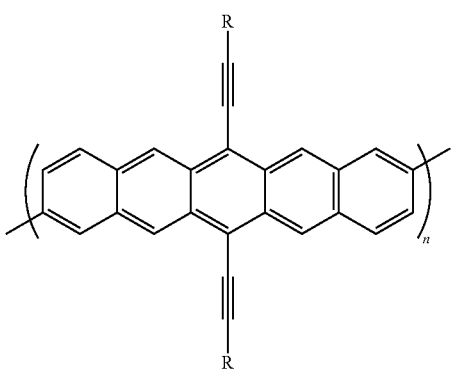

(6)

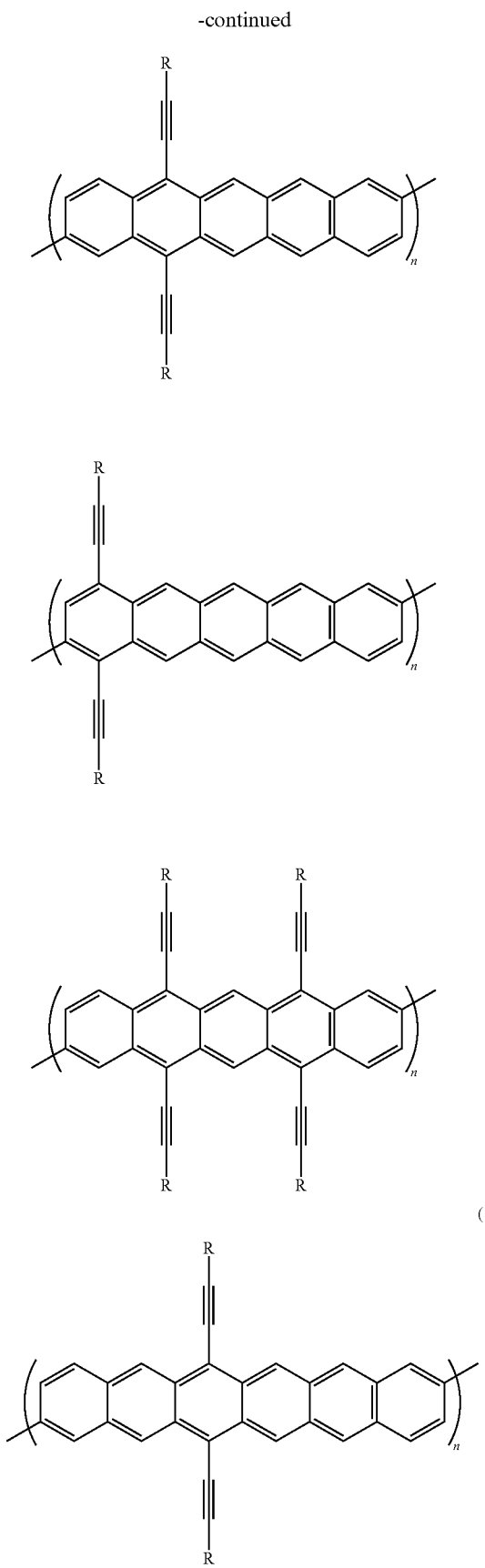

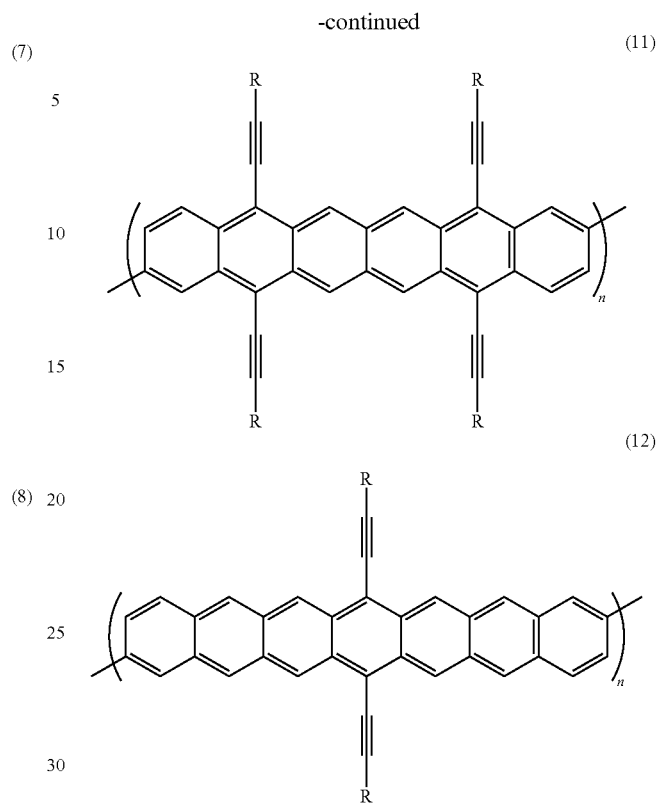

wherein each R is as illustrated herein such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; a heteroatom containing group with about 1 to about 60 carbon atoms, such as CN, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, or tri(dodecylphenyl)silyl; and wherein n is the number of repeating units in the polymer, such as, for example, 2 to about 5,000, and more specifically, from about 2 to about 1,000 or from about 20 to about 100.

There is disclosed in embodiments an electronic device comprising a semiconductive material containing a polyacene of Formula (I) wherein R is a suitable hydrocarbon, which may or may not be substituted, such as alkyl, aryl, and the like, and with, for example, from about 1 to about 40 carbon atoms, and more specifically, from about 10 to about 25 carbon atoms, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, isomeric forms thereof, or mixtures thereof; groups with, for example, from about 1 to about 40, and more specifically, from 10 to about 25 carbon atoms, such as CN, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, isomeric forms thereof, and mixtures thereof; R' and R" are each independently a hydrocarbon as illustrated herein with regard to R, and for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, isomeric forms thereof, and mixtures thereof; a heteroatom containing group as illustrated herein with respect to R, such as for example, CN, NO$_2$, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, isomeric forms thereof, and mixtures thereof; x and y each represent the number of groups; a and b each independently represent the number of rings; and n represents the number of repeating units of, for example, from about 2 to about 300.

In aspects thereof, there is disclosed an electronic device comprising a semiconductive material containing a polyacene of Formula (I)

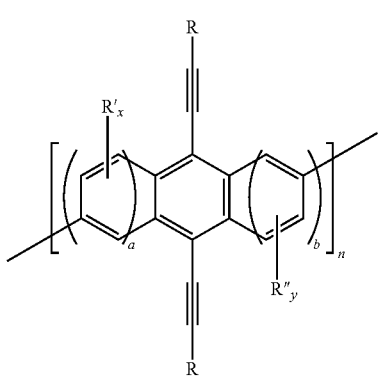

(I)

wherein R is a suitable hydrocarbon, a halogen, or a heteroatom containing group; each R' and R" are independently a suitable hydrocarbon, a heteroatom containing group, or a halogen; x and y each represent the number of groups or rings; a and b each independently represent the number of groups; and n represents the number of repeating units; a device wherein the hydrocarbon is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; a device wherein x and y is independently a number of from zero to about 12; each a and b is a number of from zero to about 3; and n represents a number of from about 2 to about 1,000; a device wherein each x and y is independently a number of from about zero to about 6; each a and b is a number of from about zero to about 3, and n represents a number of from about 10 to about 200; a device wherein each x and y is independently a number of from zero to about 4; each a and b is a number of from zero to about 4; and n represents a number of from about 20 to about 100; a device wherein at least one of R, R', or R" is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl; or thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, or mixtures thereof; a thin film transistor comprised of a substrate, a gate electrode, a gate dielectric layer, a source electrode and a drain electrode, and in contact with the source/drain electrodes and the gate dielectric layer a semiconductor layer comprised of a polyacene of the formula/structure

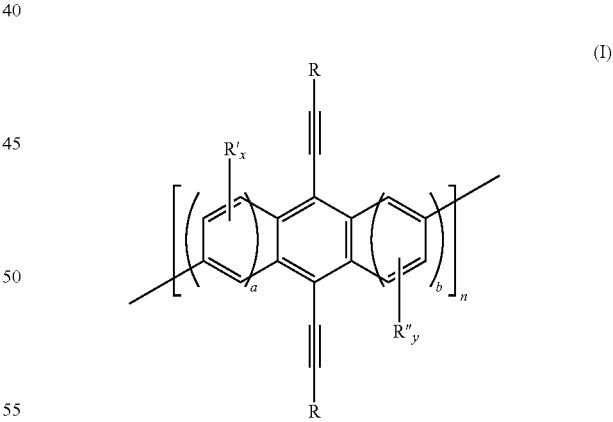

(I)

wherein R is a suitable hydrocarbon, a halogen or a heteroatom containing group; each R' and R" are independently a suitable hydrocarbon, a heteroatom containing group or a halogen; x and y each represent the number of groups; a and b each independently represent the number of rings; and n represents the number of repeating units; and in embodiments, there are disclosed processes for the preparation of polyacenes in accordance, for example, with the following reaction scheme (Scheme 1)

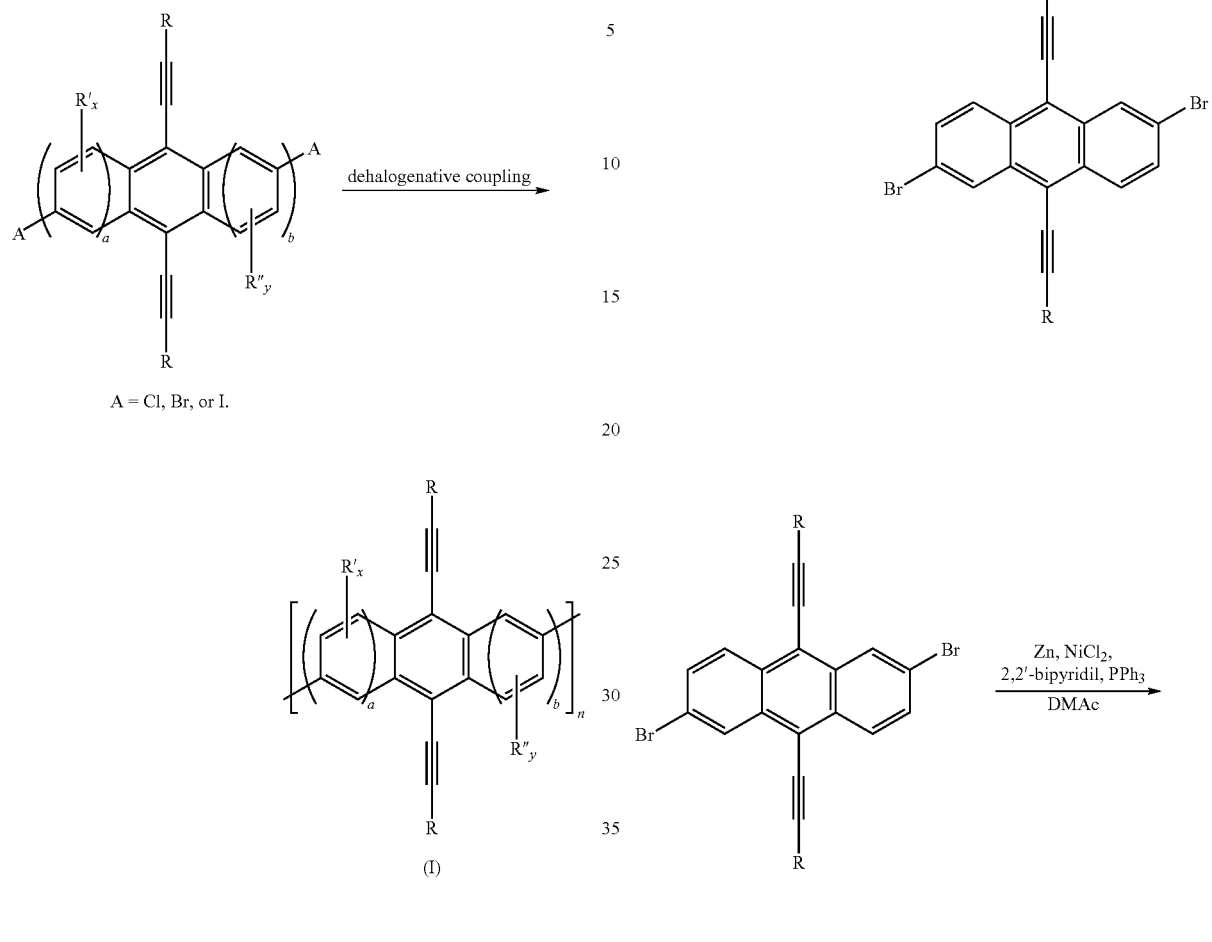

and more specifically, prepared by utilizing a dehalogenative coupling reaction of dihalogenated bis(ethynyl)acenes. More specifically, the preparation of poly(bis (ethynyl)anthracene)s can be accomplished by, for example, the dehalogenative coupling polymerization of 2,6-dibromo-9,10-bis (ethynyl)anthracenes in the presence of zinc, nickel(II) chloride, 2,2'-dipyridil, and triphenylphosphine in dimethylacetamide (DMAc) at elevated temperatures of, for example, 80° C. for a suitable timer period like 24 hours as illustrated in Scheme 2

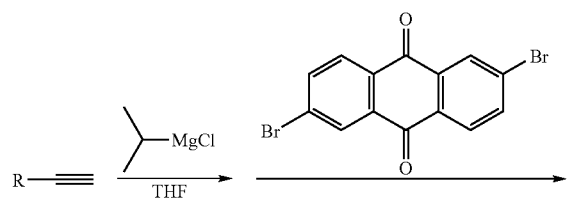

whereas the monomer 2,6-dibromo-9,10-ethynylanthracene can be readily prepared by reacting 2,6-dibromoanthracene with ethynylmagnesium chloride, followed by reduction with tin(II) chloride (Scheme 2).

Specific illustrative polyacene examples prepared in accordance with Schemes 1 and 2 are, for example,

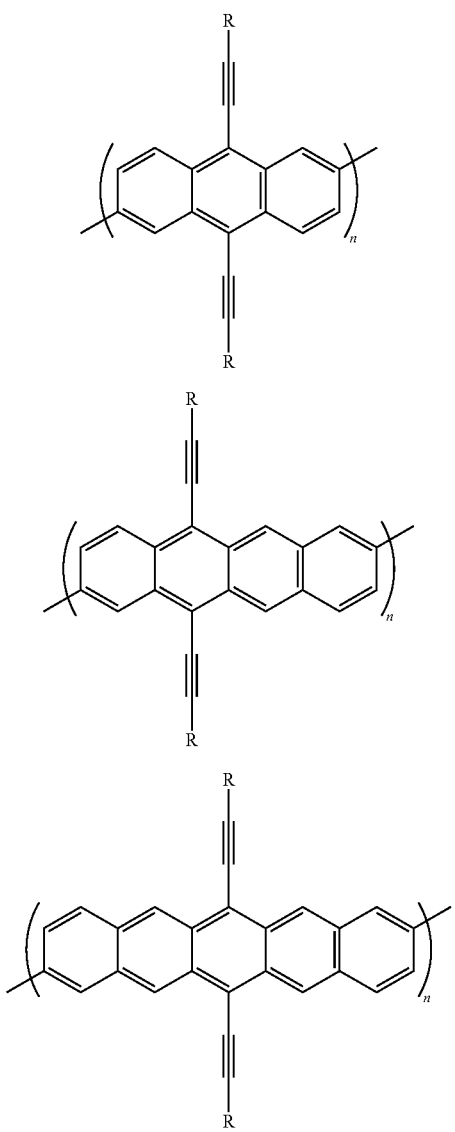

(1)

(3)

(6)

wherein each R is as illustrated herein, and n is a number of from about 20 to about 100.

The polyacenes in embodiments are soluble or substantially soluble wherein soluble refers, for example, to when the polymer can be dissolved in a solvent to form a solution with a concentration of at least 0.1 percent by weight to about 95 weight percent of the polymer; above this value, the polymer solution is sufficient to generate thin film transistors and other electronic devices in common coating solvents, for example, in embodiments they possess a solubility of at least about 0.1 percent by weight, and more specifically, from about 0.3 percent to about 5 percent by weight in such solvents as methylene chloride, 1,2-dichloroethane, tetrahydrofuran, toluene, xylene, mesitylene, chlorobenzene, dichlorobenzene, and the like. Moreover, the polyacenes of the present disclosure in embodiments, when fabricated as semiconductor channel layers in TFT devices, provide a conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the polyacenes, when fabricated from solutions as thin films of, for example, from about 10 nanometers to about 500 nanometers, or from about 50 to about 300 nanometers in thickness materials, are more stable in ambient conditions than similar devices fabricated from acenes like pentacene. When unprotected, the aforementioned polyacene materials and devices are generally stable for a number of weeks rather than days or hours as is the situation with poly (3-alkylthiophene-2,5-diyl) after exposure to ambient oxygen, thus the devices fabricated from the polyacenes in embodiments of the present disclosure can provide higher current on/off ratios, and their performance characteristics do not substantially change as rapidly as poly(3-alkylthiophene-2,5-diyl) when no rigorous procedural precautions have been taken to exclude ambient oxygen during material preparation, device fabrication, and evaluation. The polyacenes stability of the present disclosure in embodiments against oxidative doping, particularly for low cost device manufacturing, do not usually have to be handled in an inert atmosphere and the processes thereof are, therefore, simpler and more cost effective, and the fabrication thereof can be applied to large scale production processes.

DETAILED DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14, with the gate electrode having a portion thereof or the entire gate in contact with the dielectric layer 14 on top of which layer 14 two metal contacts, 20 and 22 (source and drain electrodes), are deposited. Over and between the metal contacts 20 and 22 is the polyacene layer of poly(9,10-didecynylanthracene-2,6-diyl) (1a), 12. The gate electrode can be included in the substrate, in the dielectric layer, and the like throughout.

Figure 2:
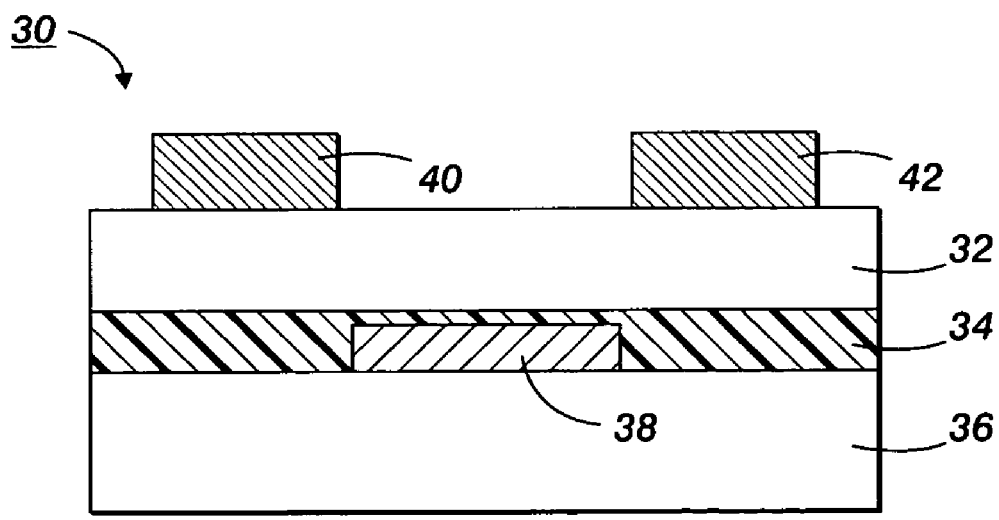

FIG. 2 schematically illustrates another TFT configuration 30 comprised of a substrate 36, a gate electrode 38, a source electrode 40, and a drain electrode 42, an insulating dielectric layer 34, and the polyacene semiconductor layer 32 of FIG. 1.

Figure 3:
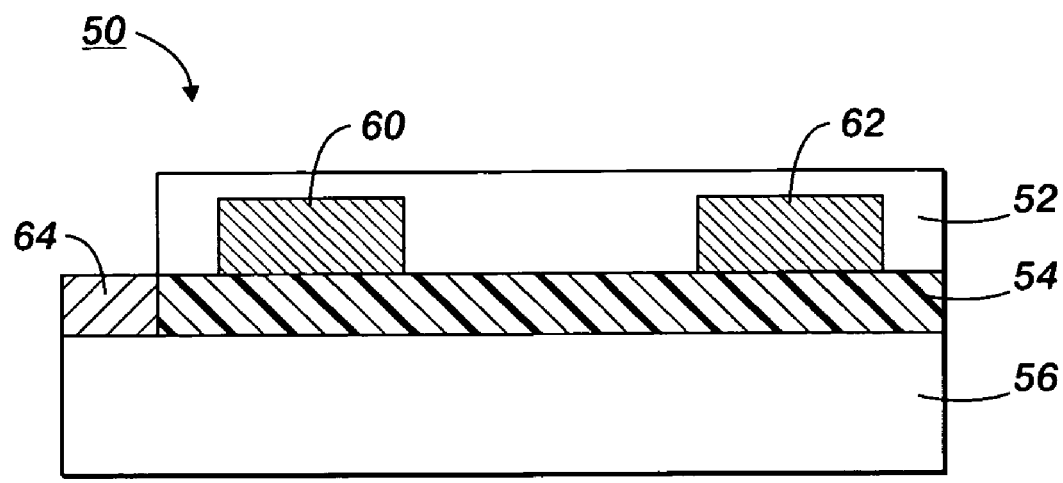

FIG. 3 schematically illustrates a further TFT configuration 50 comprised of a heavily n-doped silicon wafer 56, which can act as a gate electrode, a thermally grown silicon oxide dielectric layer 54, the polyacene of FIG. 1, 52, on top of which are deposited a source electrode 60 and a drain electrode 62; and a gate electrode contact 64.

Figure 4:
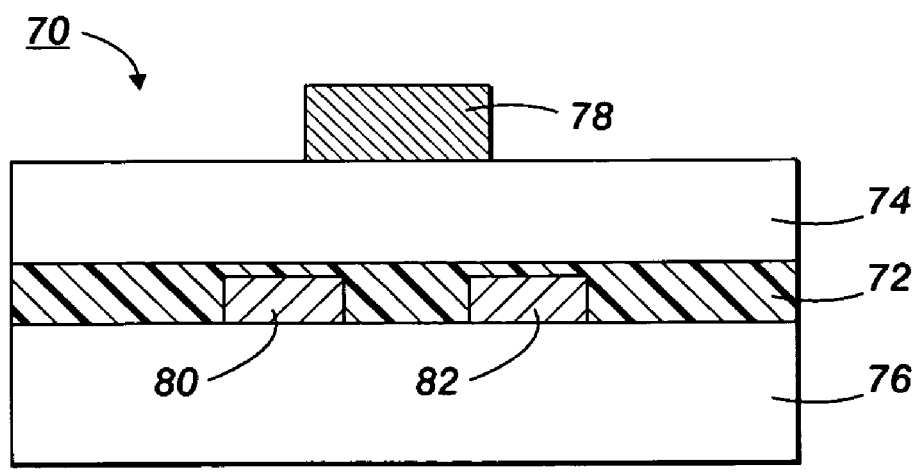

FIG. 4 schematically illustrates a TFT configuration 70 comprised of substrate 76, a gate electrode 78, a source electrode 80, a drain electrode 82, the polyacene semiconductor layer 72 of FIG. 1, and an insulating dielectric layer 74.

Also, other devices not disclosed, especially TFT devices, are envisioned, reference for example known TFT devices.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments, and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate, such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanometer-sized metal oxide particles dispersed in polymers, such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the polyacenes illustrated herein, and wherein the thickness of this layer is generally, for example, about 10 nanometers to about 1 micrometer, or about 40 to about 100 nanometers. This layer can generally be fabricated by solution process polyacenes of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials, such as gold, silver, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters, with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

Although not desiring to be limited by theory, it is believed that the ethynyl groups function primarily to minimize or avoid instability because of exposure to oxygen, and thus increase the oxidative stability of the polyacenes in solution under ambient conditions, and the R and R" substituents, such as alkyl, permit the solubility of these polymers in common solvents, such as ethylene chloride, tetrahydrofuran, toluene, chlorobenzene, dichlorobenzene, and the like.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising:
a semiconductive material containing a homopolyacene of Formula (I)

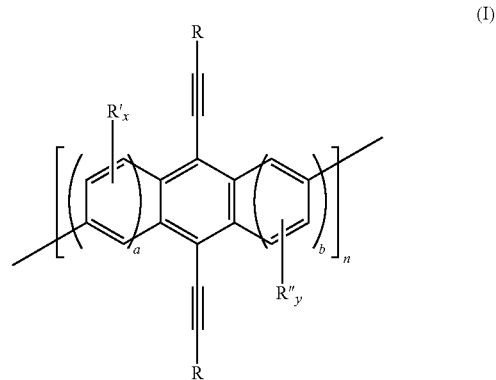

wherein R is a suitable hydrocarbon, a halogen, or a heteroatom containing group; each R' and R" are independently a suitable hydrocarbon, a heteroatom containing group, or a halogen; a represents a number of benzene rings on a left side of the central benzene ring; b represents a number of benzene rings on a right side of the central benzene ring; (a+b) is at least 2; x represents a total number of R' groups on the left side of the central benzene ring; y represents a total number of R" groups on the right side of the central benzene ring; and n represents a number of repeating units and is from 2 to about 5,000.

2. A device in accordance with claim 1 where said hydrocarbon is unsubstituted.

3. A device in accordance with claim 1 wherein said hydrocarbon is substituted.

4. A device in accordance with claim 1 wherein said hydrocarbon is alkyl or alkoxy.

5. A device in accordance with claim 1 wherein said hydrocarbon is aryl.

6. A device in accordance with claim 4 wherein said alkyl or said alkoxy contains from 1 to about 30 carbon atoms.

7. A device in accordance with claim 5 wherein said hydrocarbon is aryl and contains from 6 to about 48 carbon atoms.

8. A device in accordance with claim 1 wherein said hydrocarbon is at least one of methyl and phenyl.

9. A device in accordance with claim 1 wherein said heteroatom containing group contains from zero to about 60 carbon atoms.

10. A device in accordance with claim 1 wherein said heteroatom containing group contains from 1 to about 25 carbon atoms.

11. A device in accordance with claim 1 wherein said heteroatom containing group is $NO_2$, CN, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, or tri(dodecylphenyl)silyl.

12. A device in accordance with claim 1 wherein said halogen is chloride, fluoride, iodide, or bromide.

13. A device in accordance with claim 1 wherein said hydrocarbon is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, phenyl, methylphenyl tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl.

14. A device in accordance with claim 1 wherein at least one of said R, R' and R" is phenyl.

15. A device in accordance with claim 1 wherein each x and y is independently a number of from zero to about 12; each a and b is a number of from zero to about 3; and n represents a number of from about 2 to about 1,000.

16. A device in accordance with claim 1 wherein each x and y is independently a number of from about zero to about 6; each a and b is a number of from about zero to about 3, and n represents a number of from about 10 to about 200.

17. A device in accordance with claim 1 wherein each x and y is independently a number of from zero to about 4; each a and b is a number of from zero to about 4; and n represents a number of from about 20 to about 100.

18. A device in accordance with claim 1 wherein each x and y is zero; each a and b is a number of from zero to about 3; and n represents a number of from about 20 to about 100.

19. A device in accordance with claim 1 wherein at least one of R, R', or R" is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl; or thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, or mixtures thereof.

20. A device in accordance with claim 1 wherein each R is alkyl with about 1 to about 12 carbon atoms, aryl with from about 6 to about 24 carbon atoms, or a heteroatom containing group with from about 1 to about 16 carbon atoms.

21. A device in accordance with claim 1 wherein R is alkyl or aryl; x is from zero to 3 and y is from zero to 3; the sum of x and y is from zero to about 6; a is from zero to about 6 and b is from zero to about 6.

22. A thin film transistor comprising:
a substrate, a gate electrode, a gate dielectric layer, a source electrode and a drain electrode, and
in contact with the source/drain electrodes and the gate dielectric layer a semiconductor layer comprised of a homopolyacene of Formula (I):

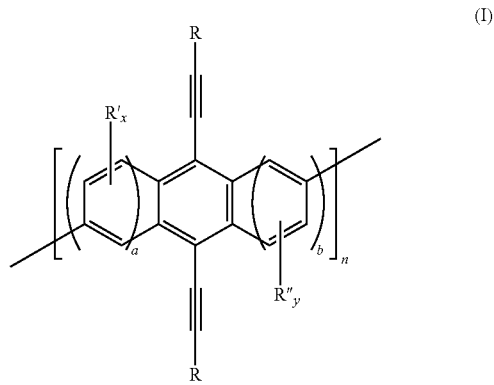

(I)

wherein R is a suitable hydrocarbon, a halogen or a heteroatom containing group; each R' and R" are independently a suitable hydrocarbon, a heteroatom containing group or a halogen; a represents a number of benzene rings on a left side of the central benzene ring; b represents a number of benzene rings on a right side of the central benzene ring; (a+b) is from 2 to about 6; x represents a total number of R' groups on the left side of the central benzene ring; y represents a total number of R" groups on the right side of the central benzene ring; and n represents a number of repeating units and is from 2 to about 5,000.

23. A transistor in accordance with claim 22 wherein said hydrocarbon is butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl.

24. A transistor in accordance with claim 22 wherein said homopolyacene is represented by the following formulas (1) through (12)

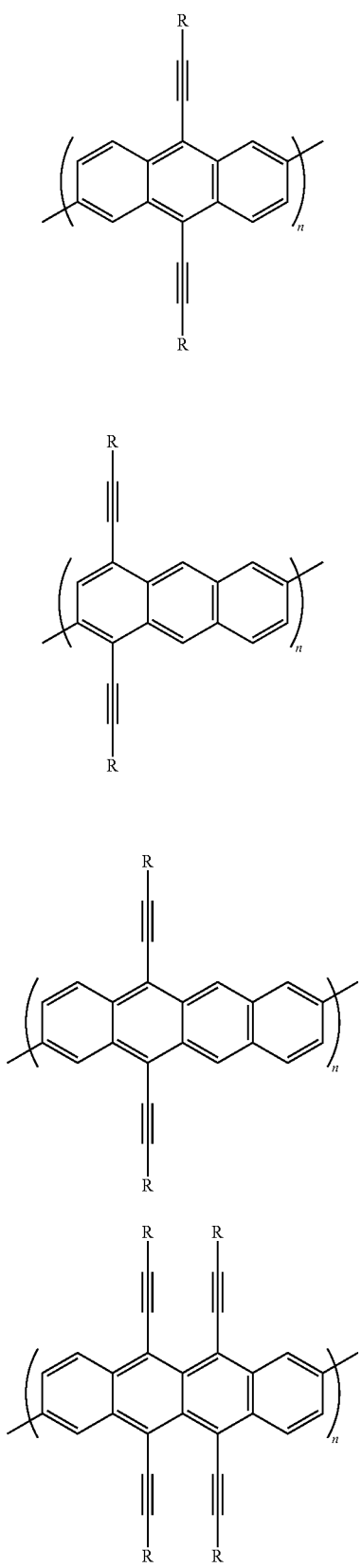
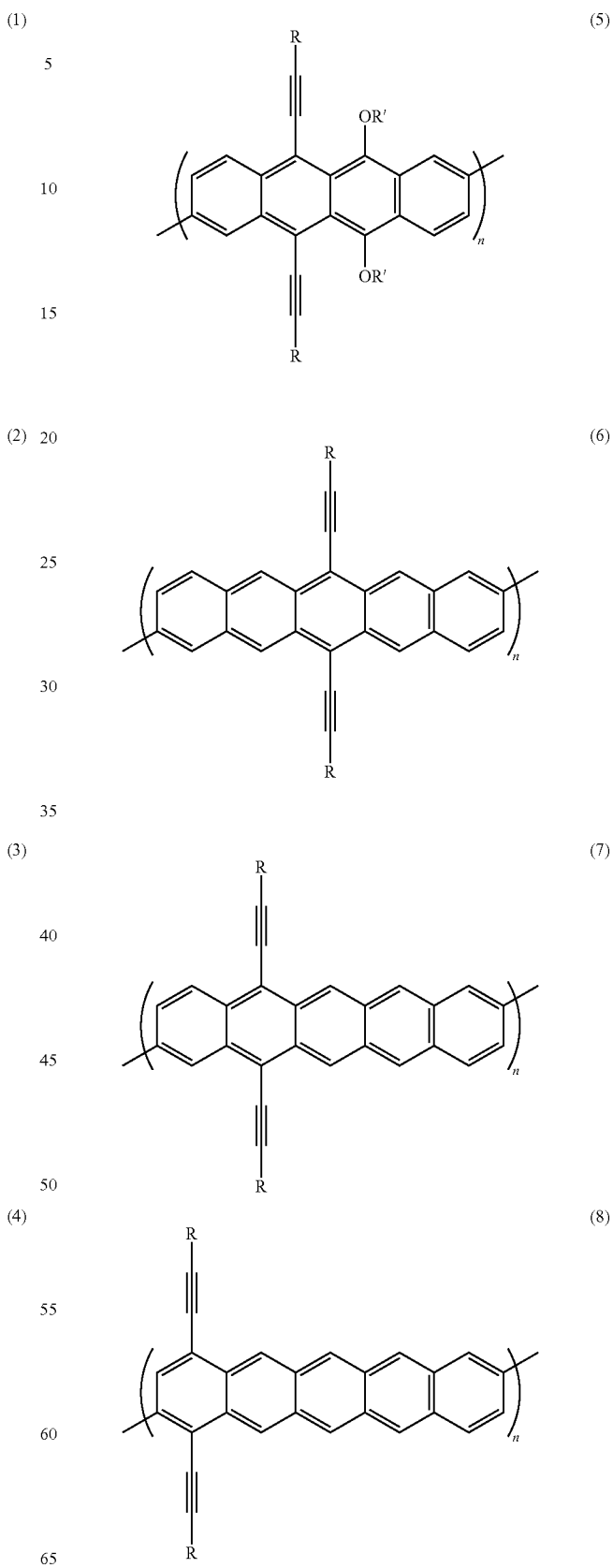

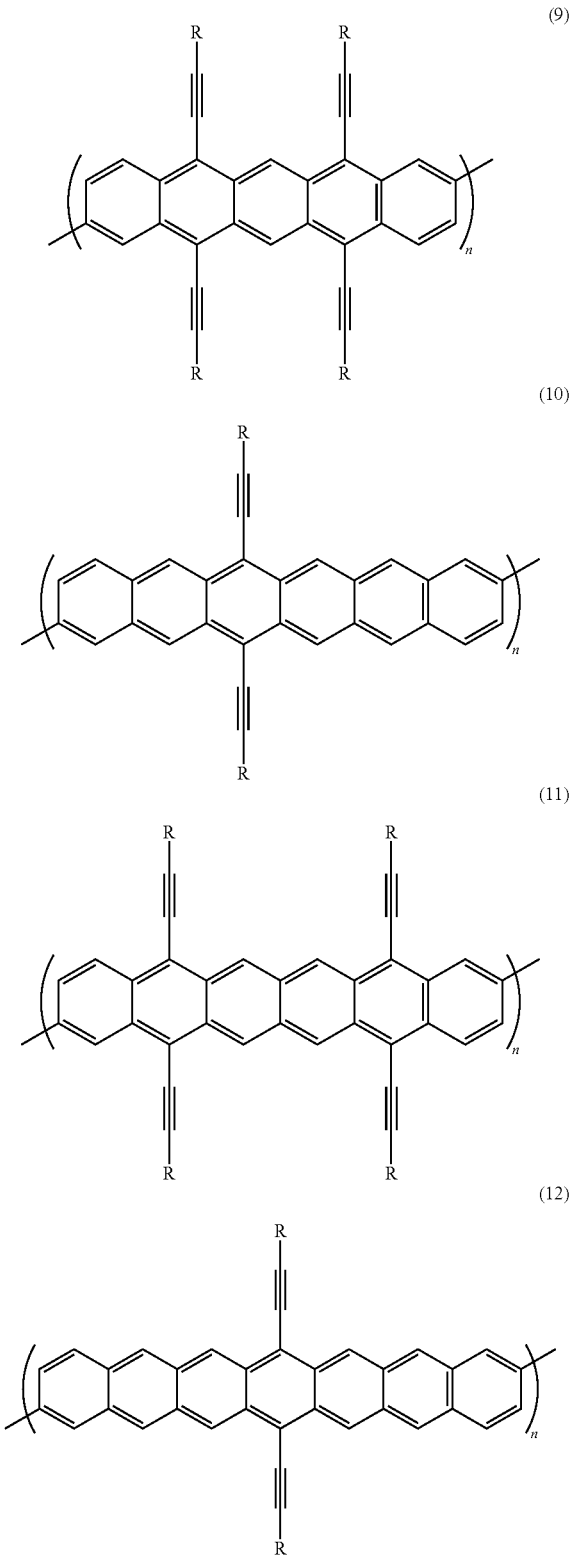

wherein at least one of R and R' is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl, a heteroatom containing group of CN, thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, or chloride, bromide, fluoride and iodide; and wherein n is from about 5 to about 100.

25. A transistor in accordance with claim 22 wherein said substrate is a plastic sheet of a polyester, a polycarbonate, or a polyimide; said gate source and drain electrodes are each independently comprised of silver, gold, nickel, aluminum, chromium, platinum, or indium titanium oxide, or a conductive polymer, and said gate dielectric layer is comprised of inorganic nitrides or oxides, organic polymers, or silicon nitride, silicon oxide; and wherein said homopolyacene is deposited by solution processes of spin coating, stamp printing, screen printing, or jet printing.

26. A transistor in accordance with claim 22 wherein said hydrocarbon is alkyl, aryl, alkoxy, a substituted alkyl, a substituted aryl, or a substituted alkoxy; and wherein said alkyl contains from 5 to about 25 carbon atoms, and said aryl contains from 6 to about 24 carbon atoms.

27. A transistor in accordance with claim 24 wherein at least one of R or R' is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl; or thiazolyl, thienyl, furyl, pyridyl, trimethylsilyl, triethylsilyl, tripropylsilyl, tributylsilyl, tripentylsilyl, trihexylsilyl, triphenylsilyl, tritolylsilyl, tri(ethylphenyl)silyl, tri(propylphenyl)silyl, tri(butylphenyl)silyl, tri(pentylphenyl)silyl, tri(hexylphenyl)silyl, tri(heptylphenyl)silyl, tri(octylphenyl)silyl, tri(nonylphenyl)silyl, tri(decylphenyl)silyl, tri(dodecylphenyl)silyl, or mixtures thereof.

28. A transistor in accordance with claim 24 wherein said polyacene is poly(9,10-bis(decynyl)anthracene-2,6-diyl), poly(9,10-bis (ethynyl)anthracene-2,6-diyl), poly(9,10-bis (dodecynyl)anthracene-2,6-dilyl), or mixtures thereof.

29. A homopolyacene as represented by Formula (I)

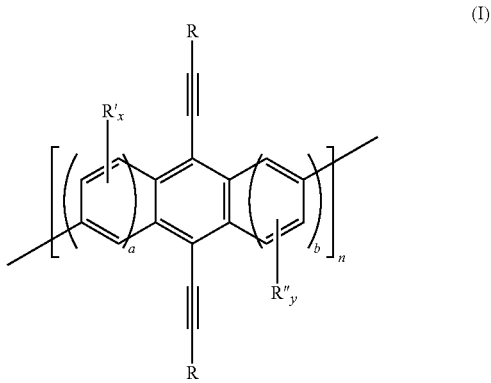

(I)

wherein R is a suitable hydrocarbon, a halogen, or a heteroatom containing group; each R' and R" are independently a suitable hydrocarbon, a heteroatom containing group or a halogen; a represents a number of benzene rings on a left side of the central benzene ring; b represents a number of benzene rings on a right side of the central benzene ring; (a+b) is from 2 to about 6; x represents a total number of R' groups on the left side of the central benzene ring; y represents a total number of R" groups on the right side of the central benzene ring; and n represents a number of repeating units and is from 2 to about 5,000; wherein the homopolyacene is a homopolymer.

30. A homopolyacene in accordance with claim 29 and selected from the group consisting of formulas (1) through (12):

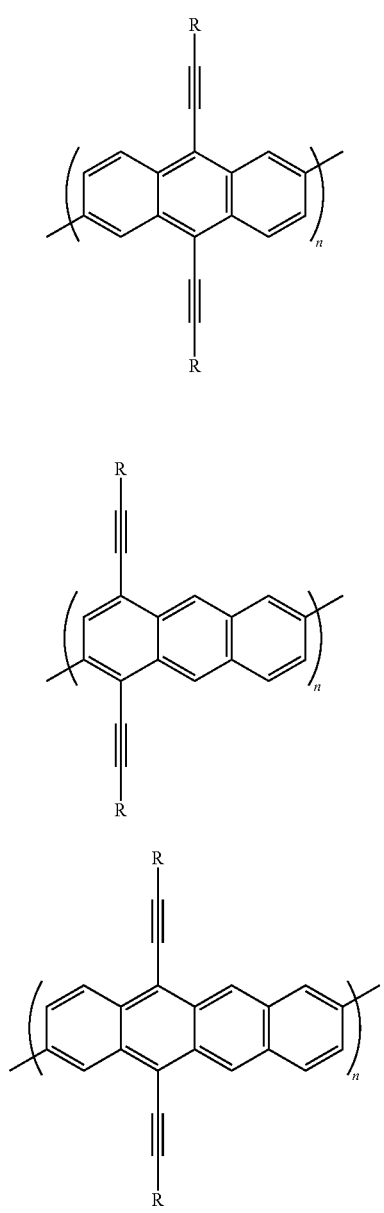

(1)

(2)

(3)

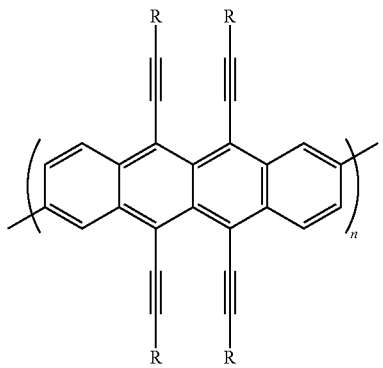

(4)

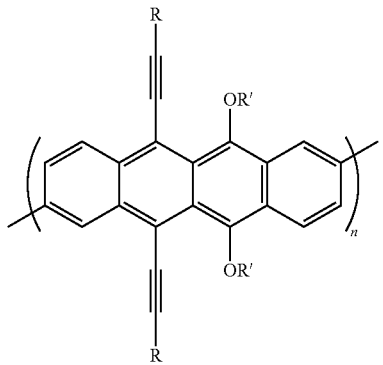

(5)

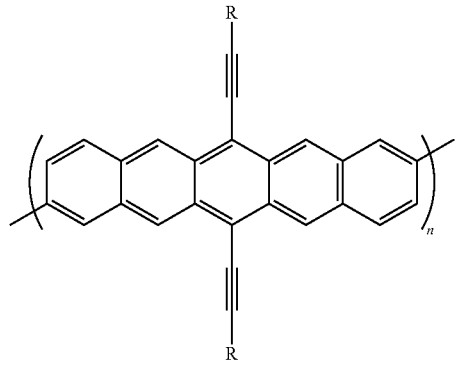

(6)

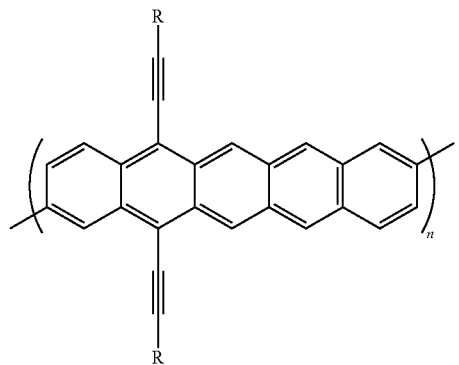

(7)

-continued (8)
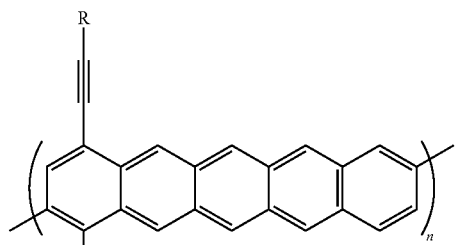

(9)
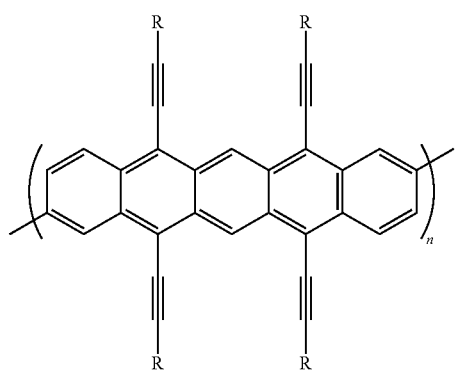

(10)
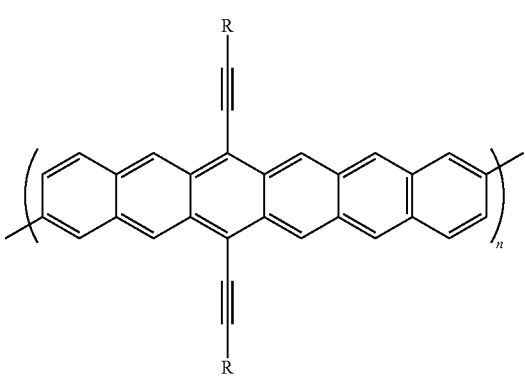

-continued

(11)
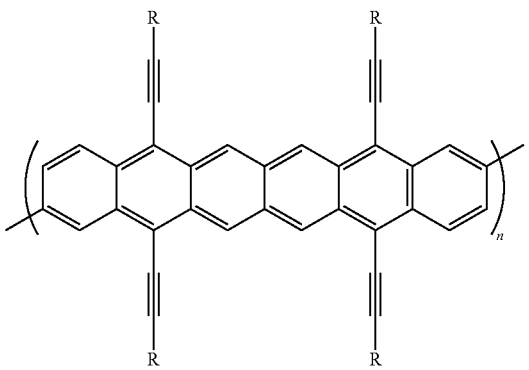

(12)
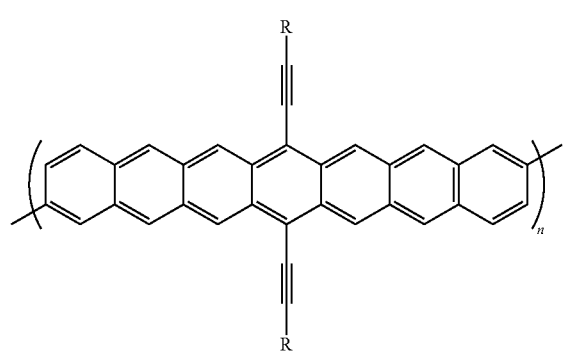

wherein each R is a substituted or unsubstituted hydrocarbon group, or a heteroatom containing group, and wherein n is a number of from about 2 to about 1,000.

31. A homopolyacene in accordance with claim 29 wherein x and y are each a number of from zero to about 12; each a and b is a number of from zero to about 6; and n represents a number of from about 2 to about 1,000.

32. A homopolyacene in accordance with claim 29 wherein said homopolyacene is poly(9,10-bis(decynyl)anthracene-2,6-diyl), poly(9,10-bis (ethynyl)anthracene-2,6-diyl), poly(9,10-bis(dodecynyl)anthracene 2,6-dilyl), or mixtures thereof.

* * * * *

UNITED STATES PATENT AND TRADEMARK OFFICE
CERTIFICATE OF CORRECTION

PATENT NO. : 7,550,760 B2
APPLICATION NO. : 11/399216
DATED : June 23, 2009
INVENTOR(S) : Yuning Li et al.

Page 1 of 1

It is certified that error appears in the above-identified patent and that said Letters Patent is hereby corrected as shown below:

In the Specification:

Column 1, line 9, after "Agreement No.", please delete "70NANBOH3033" and insert -- 70NANB0H3033 --.

Signed and Sealed this
Tenth Day of September, 2013

Teresa Stanek Rea
*Acting Director of the United States Patent and Trademark Office*